(12) United States Patent
Miller et al.

(10) Patent No.: US 8,723,057 B2
(45) Date of Patent: *May 13, 2014

(54) SYSTEMS AND METHODS FOR PROTECTING A FLIGHT RECORDER

(75) Inventors: David Lowell Miller, Kirkland, WA (US); Gary Kersten, Duvall, WA (US); Wendell A. Frost, Renton, WA (US)

(73) Assignee: Honeywell International Inc., Morristown, NJ (US)

( * ) Notice: Subject to any disclaimer, the term of this patent is extended or adjusted under 35 U.S.C. 154(b) by 51 days.

This patent is subject to a terminal disclaimer.

(21) Appl. No.: 13/552,275

(22) Filed: Jul. 18, 2012

(65) Prior Publication Data

US 2014/0022722 A1     Jan. 23, 2014

(51) Int. Cl.
*H01L 23/28* (2006.01)
*H01L 23/06* (2006.01)

(52) U.S. Cl.
USPC ........................................... 174/524; 174/565

(58) Field of Classification Search
CPC .................................................. B32B 2260/04
USPC .................................. 174/524, 565; 442/136
See application file for complete search history.

(56) References Cited

U.S. PATENT DOCUMENTS

| | | | |
|---|---|---|---|
| 4,428,998 A | | 1/1984 | Hawkinson |
| 4,600,449 A | * | 7/1986 | White et al. ................... 148/407 |
| 4,944,401 A | * | 7/1990 | Groenewegen ............... 206/521 |
| 5,123,538 A | * | 6/1992 | Groenewegen ............... 206/521 |
| 5,438,162 A | * | 8/1995 | Thompson et al. ........... 174/524 |
| 5,708,565 A | * | 1/1998 | Fairbanks ..................... 361/704 |
| 5,760,336 A | * | 6/1998 | Wang ............................. 174/535 |
| 5,859,765 A | * | 1/1999 | Grewe .......................... 361/724 |
| 5,932,839 A | | 8/1999 | Ren et al. |
| 6,040,526 A | * | 3/2000 | Olzak ........................... 174/544 |
| 6,078,011 A | | 6/2000 | Ren et al. |
| 6,184,464 B1 | * | 2/2001 | Liptak et al. .................. 174/521 |
| 6,899,161 B2 | | 5/2005 | Ren et al. |
| 7,382,959 B1 | | 6/2008 | Jacobsen |
| 7,653,276 B1 | | 1/2010 | Gross et al. |
| 7,875,812 B2 | * | 1/2011 | Steffler ......................... 174/541 |
| 8,089,807 B1 | * | 1/2012 | Steffler .................... 365/185.03 |

(Continued)

OTHER PUBLICATIONS

"Flight Autonomous Event Recorder Information Technology Open (FAERITO) Digital Data Download (D3) [Abstract only]", Feb. 4, 2002-Aug. 4, 2004, pp. 1-3, Publisher: Physical Optics Corporation.

(Continued)

*Primary Examiner* — Hung Ngo
(74) *Attorney, Agent, or Firm* — Fogg & Powers LLC

(57) ABSTRACT

Systems and methods for protecting a flight recorder are provided. In certain embodiments, a crash survivable memory unit, comprises a memory device that records flight data; a flexible insulation layer that inhibits thermal energy from conducting from an external side of the flexible insulation layer to an internal side of the flexible insulation layer, wherein the internal side faces the memory device; a microlattice layer abutting the internal side and enclosing the memory device, the microlattice layer configured to distribute thermal energy that passes through the flexible insulation layer substantially throughout the microlattice layer; and a heat absorbing material that impregnates the microlattice layer, the heat absorbing material configured to absorb the thermal energy in the microlattice layer; and an impact resistant layer encircling the flexible insulation layer, wherein the impact resistant layer absorbs shocks that result from other objects contacting the impact resistant layer.

20 Claims, 4 Drawing Sheets

(56) References Cited

U.S. PATENT DOCUMENTS

| | | |
|---|---|---|
| 8,155,496 B1 | 4/2012 | Cumberland et al. |
| 2011/0195363 A1 | 8/2011 | Rock et al. |
| 2014/0020878 A1 | 1/2014 | Miller et al. |

OTHER PUBLICATIONS

Shankland, "Breakthrough Material is Barely More Than Air", Nov. 18, 2011, pp. 1-3, Publisher: http://news.cnet.com/8301-30685_3-57327382264/breakthrough-material-is-barely-more-than-air/ Dec. 2, 2011 11:32:01 AM.

Aspen Aerogels, Inc., "Pyrogel XTF Data Sheet", 2010, pp. 1-2, Publisher: Aspen Aerogels, Inc.

U.S. Patent and Trademark Office, "Restriction Requirement", "from U.S. Appl. No. 13/552,243", Jan. 2, 2014, pp. 1-7, Published in: US.

U.S. Patent and Trademark Office, "Office Action", "from U.S. Appl. No. 13/552,243", Feb. 14, 2014, pp. 1-22, Published in: US.

\* cited by examiner

SYSTEMS AND METHODS FOR PROTECTING A FLIGHT RECORDER

This application is related to the following co-pending U.S. patent application, which is hereby incorporated herein by reference:

U.S. patent application Ser. No. 13/552,243 entitled "SYSTEMS AND METHODS FOR A PROTECTIVE CASING" filed on even date herewith and which is referred to herein as the '151 application.

BACKGROUND

Because flight recorders must survive the extreme conditions caused by disastrous airplane crashes, the crash survivable memory unit within the flight recorder requires extreme mechanical robustness, along with the ability to absorb a large quantity of thermal energy in a short time period. To withstand the extreme conditions, crash survivable memory units are insulated from the heat by brittle insulating materials and relatively uncompressible heat absorbing materials. Generally, the insulating material surrounds a layer of heat absorbing material, and the heat absorbing material surrounds a data storage device. Because the insulating material and heat absorbing material is either brittle or uncompressible, to protect the crash survivable memory, the enclosure is generally constructed from heavy gauge hardened steel so that the enclosure experiences as little deformation as possible.

Generally, an optimization process is used when designing the steel enclosure, the insulating material and the heat absorbing material to reduce the total enclosed volume and weight of the enclosure while still protecting against the extreme conditions of an aircraft crash. However, optimization of the enclosure geometry for structural robustness and practical limitations on the dimensions of the data storage device lead to uneven distribution of insulating and/or heat absorbing material. Further, the resultant crash survivable memory unit accounts for more than 70% of the total weight of a flight recorder with the steel enclosure accounting for approximately 65% of the weight of the crash survivable memory unit.

SUMMARY

Systems and methods for protecting a flight recorder are provided. In at least one embodiment, a crash survivable memory unit, comprises a memory device configured to record flight data; a flexible insulation layer configured to inhibit thermal energy from conducting from an external side of the flexible insulation layer to an internal side of the flexible insulation layer, wherein the internal side of the flexible insulation layer faces the memory device. The crash survivable memory unit also includes a microlattice layer abutting the internal side of the flexible insulation layer and enclosing the memory device, the microlattice layer configured to distribute thermal energy that passes through the flexible insulation layer substantially throughout the microlattice layer; and a heat absorbing material that impregnates the microlattice layer, the heat absorbing material configured to absorb the thermal energy in the microlattice layer; and an impact resistant layer encircling the flexible insulation layer, wherein the impact resistant layer is configured to absorb shocks that result from other objects contacting the impact resistant layer.

BRIEF DESCRIPTION OF THE DRAWINGS

Features of the present invention will become apparent to those skilled in the art from the following description with reference to the drawings. Understanding that the drawings depict only typical embodiments and are not therefore to be considered limiting in scope, the invention will be described with additional specificity and detail through the use of the accompanying drawings, in which.

DETAILED DESCRIPTION

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense.

Embodiments of the present disclosure provide methods and systems for protecting a flight recorder in the extreme environment present during an aircraft disaster.

Figure 1:
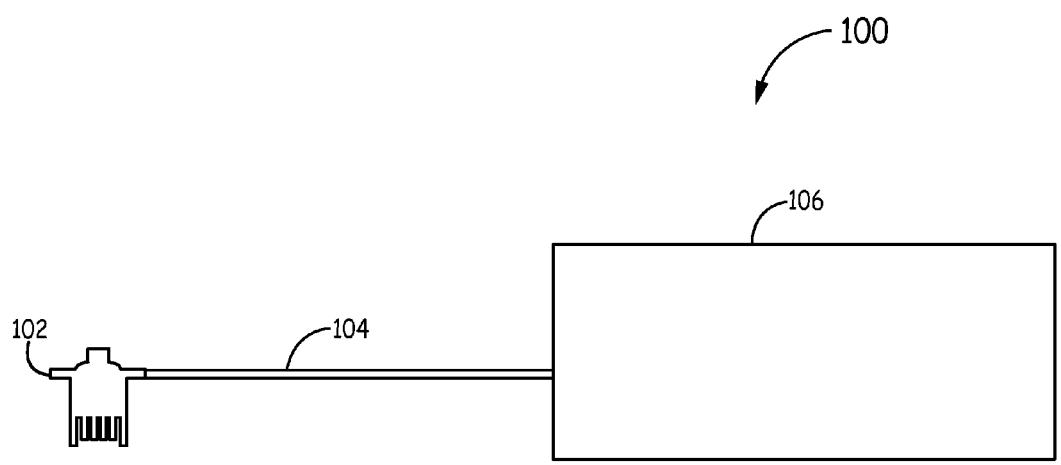
FIG. 1 is a diagram illustrating the components of a flight recorder according to one embodiment.

FIG. 1 is a diagram of components in a flight recorder 100. The flight recorder 100 is an electronic device that records instructions sent to electronic systems on an aircraft. For example, flight recorder 100 can include a flight data recorder, a cockpit voice recorder, an image recorder, and a CNS/ATM (datalink) recorder. Also, in certain implementations, the flight recorder 100 is able to record audio and/or video images in certain locations of the aircraft like the cockpit. Flight recorder 100 includes a data interface 102, a communication cable 104, and a crash survivable memory unit (CSMU) 106. The data interface 102 provides an interface between the flight recorder's 100 circuitry for input and conditioning of signals from different electrical systems on the aircraft and the Crash Survivable Memory. For example, the data interface 102 receives the information describing the commands transmitted to the different electronic systems on the aircraft. Also, the data interface 102 receives audio information to describe conversations between a flight crew, and other ambient sounds in the aircraft. Further, the data interface 102 receives video information from the aircraft. The data interface 102 receives and transmits the data to CSMU 106 over a communication cable 104. Communication cable 104 is capable of transmitting the necessary data to the CSMU 106 in such a way that it is readily recordable by the CSMU 106. For example, communication cable 104 can include a flexprint cable, a co-axial cable, a fiber optic cable, or the like. In certain embodiments, when an aircraft experiences a crash, the data interface 102 and the communication cable 104 can be destroyed without damaging data stored in memory in the CSMU 106.

However, to preserve the data that has been recorded, the CSMU 106 is designed to withstand the extreme environment that occurs during aircraft disasters. To ensure that the CSMU 106 is able to withstand the extreme environment of an airplane crash, CSMU 106 is rigorously tested. For example, the CSMU 106 is designed to withstand a crash impact of 3,400 Gs. The CSMU 106 also is resistant to penetration, as the most vulnerable axis of the CSMU 106 can withstand the force caused by the drop of a 500 pound weight with a 0.25 square inch pin protruding from the bottom of the weight from a height of ten feet. Further, the CSMU 106 can also withstand temperatures of 1100° C. for at least an hour. The CSMU 106 can undergo other tests to test the resistance of the CSMU to pressure, liquid, and chemical forces that may be present in the event of an aircraft disaster. To be able to withstand the extreme environment that exists during an aircraft crash and the above described rigorous testing, the CSMU 106 is made of materials that function together to protect a memory unit within CSMU 106 from being damaged by an airplane crash.

Figure 2:
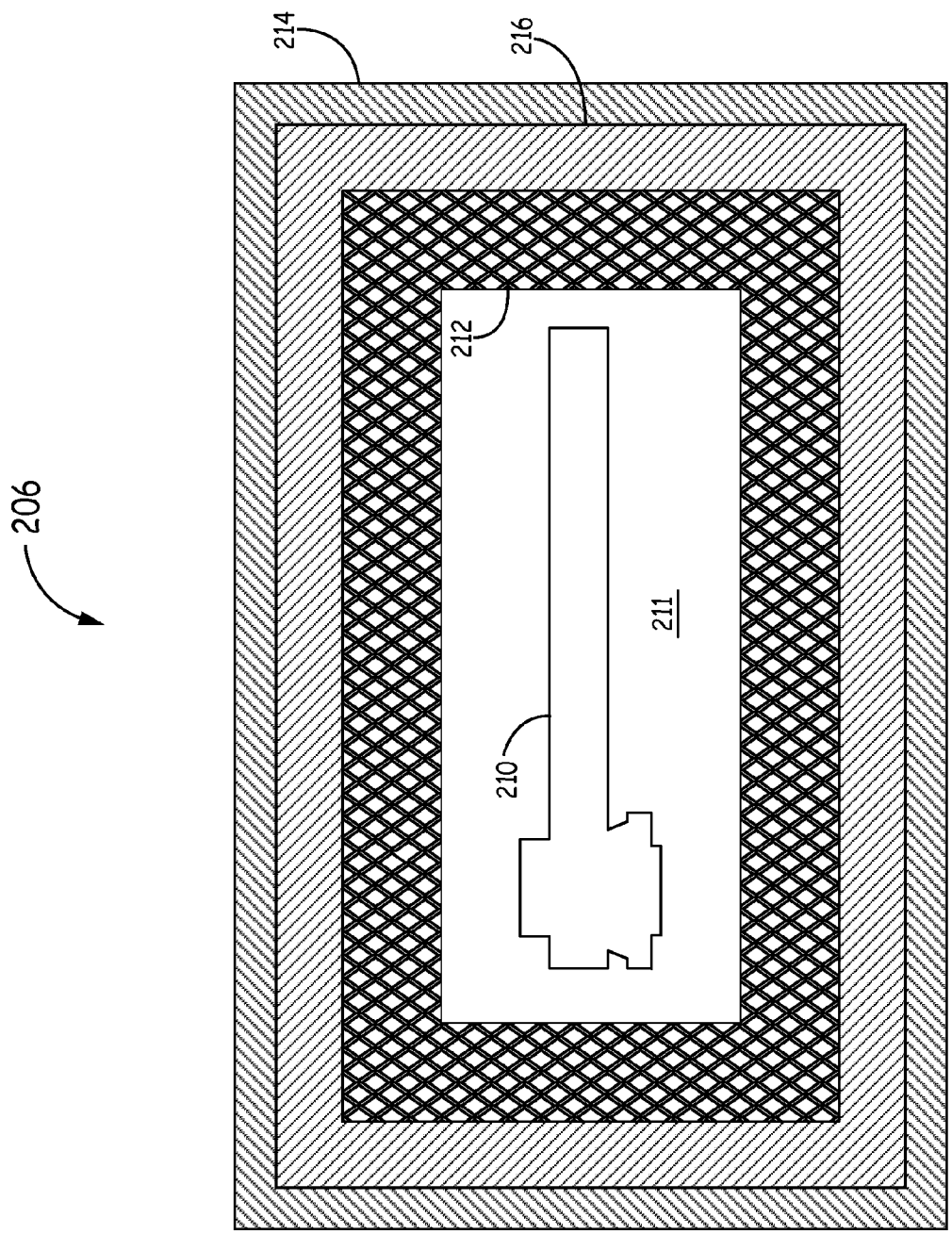
FIG. 2 is a block diagram illustrating the components of a crash survivable memory unit according to one embodiment.

FIG. 2 is a diagram illustrating the components of a CSMU 206 according to one embodiment. CSMU 206 includes components that protect a memory unit 210. During normal operation, memory unit 210 is connected to the communication cable 104 in FIG. 1. Memory unit 210 is a medium that stores data for future retrieval. For example, memory unit 210 can store data through a magnetic tape, a hard drive, a solid state memory device, a metal engraving, and the like. As memory unit 210 is susceptible to damage caused by shocks and heat, the memory unit 210 is enclosed within protective structures that inhibit heat and shocks from affecting the memory unit 210. For example, the memory unit 210 can be surrounded by a metallic microlattice layer 212, a flexible insulation layer 216, and an impact resistant layer 214. In at least one embodiment, CSMU 206 includes heat absorption material 211 within microlattice layer 212 that surrounds the memory unit 210.

Microlattice layer 212 is a layer that encapsulates the memory unit in a metallic microlattice. In certain embodiments, the metallic microlattice is a three-dimensional microstructure. In certain embodiments, the microlattice is a structure that can be used as a supporting scaffolding in an apparatus for storing thermal energy, where the microlattice layer 212 includes a thermal storage material and the microlattice supporting scaffolding. The microlattice generally includes multiple sections of truss elements.

Figure 3:
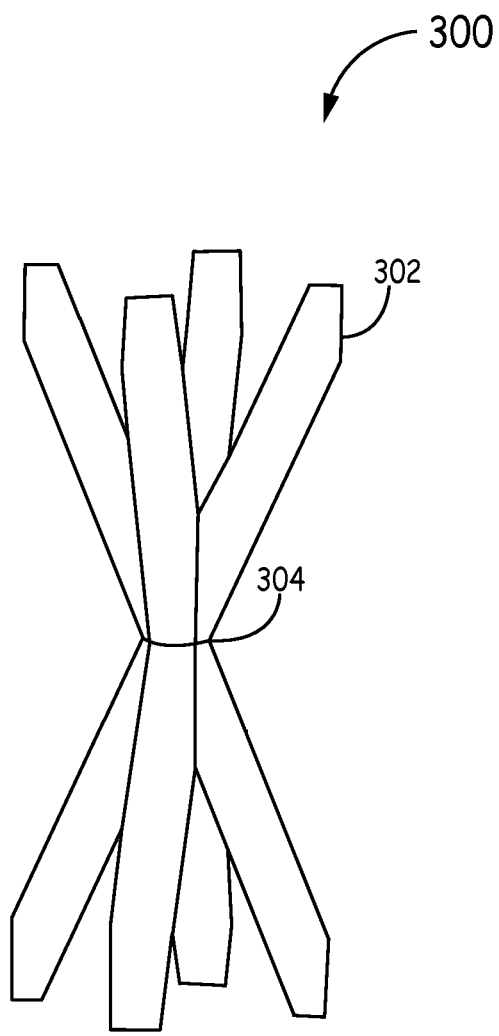
FIG. 3 is a diagram illustrating a section of truss elements used to construct a microlattice layer according to one embodiment.

FIG. 3 is a diagram illustrating a section 300 of truss elements 302 that are used to form the microlattice supporting scaffolding. In at least one exemplary embodiment, the section 300 includes eight different truss elements 302 that are joined together at a node 304. The section 300 of truss elements 302 can include more or less than eight different truss elements 302 in other embodiments. As shown in FIG. 3, the different truss elements 302 interpenetrate each other at node 304 to form the section 300. The microlattice supporting scaffolding in microlattice layer 212 in FIG. 2 is formed by multiple sections 300 that are joined together to form a continuous lattice structure.

In one embodiment, multiple truss elements 302 in section 300 are formed continuously such that the interior of two conjoined truss elements 302, within the section of truss elements 300, forms a contiguous void having no interior boundaries. When the interior of the different truss elements 300 lacks interior boundaries, the nodes connecting the different truss elements 302 is made of the same material as the material used to fabricate the truss elements 302.

The truss elements 302 in section 300 have an intrinsically high strength due to the small size of truss elements 302. Further, the truss elements 302 are configured to have a correspondingly small aspect ratio (e.g., length/diameter ratio) for withstanding a bending moment. Also, as microlattice layer 212 in FIG. 2 is formed from multiple conjoined sections of truss elements 300, microlattice layer 212 is able to withstand mechanical loads via axial tension and compression of the truss elements in section 300. Molecular alignment of the truss elements 302 along their respective axial directions lends additional strength and/or stiffness to the truss elements 302 and, accordingly, also to microlattice layer 212.

Further, in at least one implementation, the truss elements 302 are configured to provide the microlattice layer 212 in FIG. 2 with a stretch-dominated behavior under a compression load applied to microlattice layer 212.

As illustrated in FIG. 3, truss elements 302 respectively extend in different directions away from node 304. For example, according to at least one embodiment, section 300 of truss elements 302 may include eight truss elements 302, each of which extends along a corresponding one of eight varying directions away from the node 304. In at least one implementation, the eight truss elements 302 interpenetrate one another at node 304 to form a section of continuous material.

In certain implementations, when multiple sections of truss elements 300 are joined together to form a microlattice layer, like microlattice layer 212 in FIG. 2, a significant portion of the microlattice layer 212 is free space. In certain implementations, the free space within the microlattice layer 212 is filled at least partially with a material different from the material of the microlattice structure itself. For example, the free space within microlattice layer 212 can be filled with a material that absorbs thermal energy, where the microlattice supporting scaffolding within microlattice layer 212 distributes the thermal energy substantially evenly throughout the absorbing material in the free space within microlattice layer 212.

In at least one embodiment, microlattice layer 212 is fabricated to absorb thermal energy by providing a metallic microlattice as a three-dimensional ordered open-cellular structure that functions as a scaffold. The open cells are then filled with a phase change material. Examples of suitable phase change materials are hydrocarbons, organic molecules, fatty acids, salt hydrates, bicarbonate of soda, and the like. In at least one implementation, the memory unit 210 is packed within a heat absorption material 211 that includes a phase change material, where the heat absorption material 211 is enclosed within the microlattice layer 212. Heat absorption material is further described in the following U.S. patents all of which are incorporated by reference: U.S. Pat. No. 5,932, 839, entitled "METHOD FOR DISSIPATING HEAT AWAY FROM HEAT SENSITIVE DEVICE USING BICARBONATE COMPOSITIONS" filed on Nov. 4, 1997, referred to herein as the '839 patent; U.S. Pat. No. 6,078,011, entitled "METHOD FOR DISSIPATING HEAT AWAY FROM A HEAT SENSITIVE DEVICE USING BICARBONATE COMPOSITION" filed on May 6, 1999, referred to herein as the '011 patent; and U.S. Pat. No. 6,899,161, entitled "METHOD FOR HEAT ABSORPTION USING POLYOXYMETHLENE POLYMER COMPOSITIONS" filed on Apr. 3, 2003, referred to herein as the '161 patent.

As described above with respect to FIG. 2, the memory unit 210 and the microlattice layer 212 are enclosed within a flexible insulation layer 216. The flexible insulation layer 216 inhibits the transfer of heat through the flexible insulation layer 216 to protect the memory unit 210 from a heated environment containing the CSMU 206. For example, when CSMU 206 is in a heated environment, the flexible insulation layer 216 inhibits the transfer of heat through the flexible insulation layer 216 to the microlattice layer 212. The heat that does get transferred through the flexible insulation layer 216, is absorbed by heat absorption material that is contained within the microlattice layer 212. The combination of the flexible insulation layer 216 and the microlattice layer 212 function jointly to inhibit heat in the environment of the CSMU from damaging memory unit 210.

Further, the combination of flexible insulation layer 216 and microlattice layer 212 function jointly to prevent shocks to the CSMU 206 from damaging memory unit 210. In one exemplary implementation, the flexible insulation layer 216 comprises a layer of flexible aerogel or other flexible insulator. In at least one implementation the flexible aerogel layer 216 is PYROGEL XTF. Flexible insulation layer 216 is deformable and able to move in response to shocks. Further, microlattice layer 212 is also deformable and able to move in response to shocks. Due to the deformability of both the flexible insulation layer 216 and the microlattice layer 212, the flexible insulation layer 216 and microlattice layer 212 are able to absorb energy produced by shocks applied to the CSMU 206 and prevent the shocks from damaging the memory unit 210.

Further, to protect the memory unit 210 from further damage in the event of an aircraft disaster, the CSMU 206 includes an impact resistant layer 214. Impact resistant layer 214 is a hard layer that is designed to withstand impacts at the high forces present in an aircraft disaster without breaching. For example, impact resistant layer 214 can be fabricated from a metal, a composite material (e.g., a carbon composite), or the like. In contrast to impact resistant layers on traditional CSMUs, the combination of the flexible insulation layer 216 and the microlattice layer 212, which both have shock absorbent qualities, allow for a thinner impact resistant layer 214 than is found on traditional CSMUs. The thinner impact resistant layer 214 reduces the size and weight of CSMU 206. Thus, the combination of the impact resistant layer 214, the flexible insulation layer 216, and the microlattice layer 212 function together to protect the memory unit 210 from forces caused by the extreme environment present during an aircraft disaster.

Figure 4:
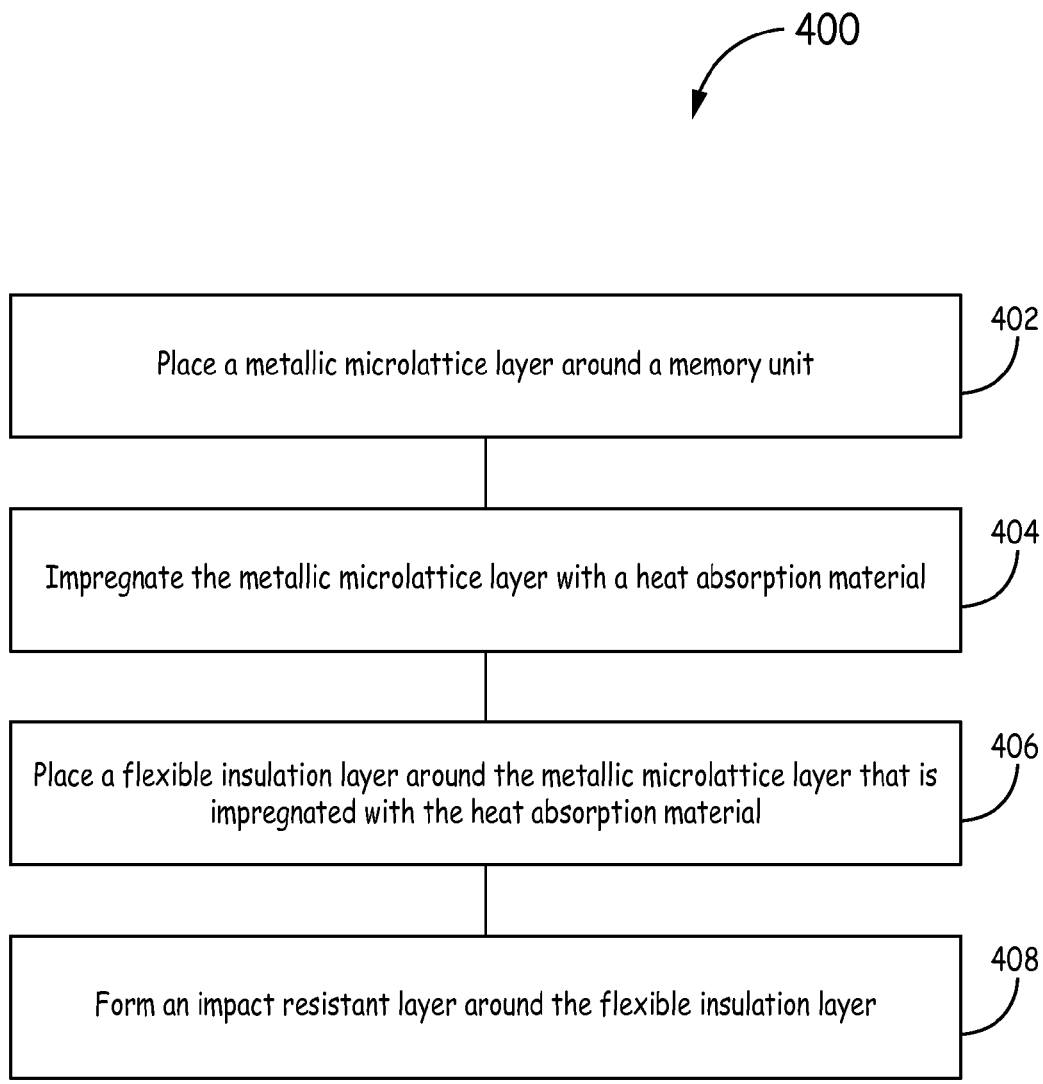
FIG. 4 is a flow diagram of a method for constructing a crash survivable memory unit according to one embodiment.

FIG. 4 is a flow diagram of a method 400 for fabricating a CSMU according to one embodiment. Method 400 proceeds at 402 where a metallic microlattice layer is placed around a memory unit. As discussed above, the metallic microlattice layer is a structure of truss elements that provide a compressible scaffolding layer around the memory unit. Method 400 proceeds at 404, where the metallic microlattice layer is impregnated with a heat absorption material. The heat absorption material includes a phase change material such as a bicarbonate of soda, or other phase change material. The metallic microlattice layer distributes heat throughout the heat absorption material to impede thermal energy from reaching the memory unit.

Method 400 proceeds at 406 where a flexible insulation layer is placed around the metallic microlattice layer that is impregnated with the heat absorption material. For example, a layer of flexible aerogel can be placed around the metallic microlattice layer. The flexible aerogel impedes the transfer of heat from the external layers of the CSMU to the inner layers surrounding the memory unit. Method 400 proceeds at 408 where an impact resistant layer is formed around the flexible insulation layer. For example, the impact resistant layer absorbs shocks to the CSMU and encapsulates the metallic microlattice layer and the metallic microlattice layer. The combination of the multiple layers of the CSMU that surround the memory unit protect the memory unit from forces caused by the extreme environment present during an aircraft disaster.

EXAMPLE EMBODIMENTS

Example 1 includes a crash survivable memory unit, comprising a memory device configured to record aircraft data; a microlattice layer that surrounds the memory device, wherein the microlattice is impregnated with a heat absorbing material; a flexible insulation layer that surrounds the microlattice layer; and an impact resistant layer that surrounds the flexible insulation layer.

Example 2 includes the crash survivable memory unit of Example 1, wherein the heat absorbing material comprises a phase change material.

Example 3 includes the crash survivable memory unit of Example 2, wherein the phase change material comprises at least one of a hydrocarbon; an organic chemical, a fatty acid, a salt hydrate; and a bicarbonate of soda.

Example 4 includes the crash survivable memory unit of any of Examples 1-3, wherein the flexible insulation layer comprises at least one of an insulative wool; a foam; and a flexible aerogel.

Example 5 includes the crash survivable memory unit of any of Examples 1-4, wherein the impact resistant layer comprises a metal.

Example 6 includes the crash survivable memory unit of Example 5, wherein the impact resistant layer is deformable.

Example 7 includes the crash survivable memory unit of any of Examples 1-6, wherein the impact resistant layer comprises a composite material.

Example 8 includes the crash survivable memory unit of any of Examples 1-7, wherein the memory unit stores data related to at least one of aircraft operation parameters; pilot communications; ambient sounds and video images.

Example 9 includes the crash survivable memory unit of any of Examples 1-8, wherein the memory unit is encased in a heat absorbing material.

Example 10 includes the crash survivable memory unit of any of Examples 1-9, wherein the memory unit is at least one of a solid state memory device; a tape memory device; and a magnetic memory device.

Example 11 includes a method for protecting a memory unit, the method comprising placing a metallic microlattice layer around a memory unit; impregnating the metallic microlattice layer with a heat absorption material; placing a flexible insulation layer around the metallic microlattice layer that is impregnated with the heat absorption material; and forming an impact resistant layer around the flexible insulation layer.

Example 12 includes the method of Example 11, wherein the flexible insulation layer is comprised of a flexible aerogel.

Example 13 includes the method of any of Examples 11-12, wherein the heat absorption material comprises a phase change material.

Example 14 includes the method of any of Examples 11-13, further comprising determining a level of protection for the memory unit, wherein determining the level of protection comprises testing the response of the memory unit to impacts; testing the response of the memory unit to a heated environment; and testing the interaction of the memory unit with fluids at different pressures.

Example 15 includes a crash survivable memory unit, comprising a memory device configured to record flight data; a flexible insulation layer configured to inhibit thermal energy from conducting from an external side of the flexible insulation layer to an internal side of the flexible insulation layer, wherein the internal side of the flexible insulation layer faces the memory device; a microlattice layer abutting the internal side of the flexible insulation layer and enclosing the memory device, the microlattice layer configured to distribute thermal energy that passes through the flexible insulation layer substantially throughout the microlattice layer; a heat absorbing material that impregnates the microlattice layer, the heat absorbing material configured to absorb the thermal energy in the microlattice layer; and an impact resistant layer encircling the flexible insulation layer, wherein the impact resistant layer is configured to absorb shocks that result from other objects contacting the impact resistant layer.

Example 16 includes the crash survivable memory unit of Example 15, wherein the impact resistant layer comprises at least one of a composite material; and a metal.

Example 17 includes the crash survivable memory unit of any of Examples 15-16, wherein the heat absorbing material comprises a phase change material.

Example 18 includes the crash survivable memory unit of Example 17, wherein the phase change material comprises at least one of a hydrocarbon; an organic chemical, a fatty acid, a salt hydrate; and a bicarbonate of soda.

Example 19 includes the crash survivable memory unit of any of Examples 15-18, further comprising additional heat absorbing material that is encapsulated within the microlattice layer and envelopes the memory device.

Example 20 includes the crash survivable memory unit of any of Examples 15-19, wherein the flexible insulation layer comprises at least one of an insulative wool; a foam; and a flexible aerogel.

The present invention may be embodied in other specific forms without departing from its essential characteristics. The described embodiments are to be considered in all respects only as illustrative and not restrictive. The scope of the invention is therefore indicated by the appended claims rather than by the foregoing description. All changes that come within the meaning and range of equivalency of the claims are to be embraced within their scope.

What is claimed is:

1. A crash survivable memory unit, comprising:
   a memory device configured to record aircraft data;
   a microlattice layer that surrounds the memory device, wherein the microlattice is impregnated with a heat absorbing material;
   a flexible insulation layer that surrounds the microlattice layer; and
   an impact resistant layer that surrounds the flexible insulation layer.

2. The crash survivable memory unit of claim 1, wherein the heat absorbing material comprises a phase change material.

3. The crash survivable memory unit of claim 2, wherein the phase change material comprises at least one of:
   a hydrocarbon;
   an organic chemical,
   a fatty acid,
   a salt hydrate; and
   a bicarbonate of soda.

4. The crash survivable memory unit of claim 1, wherein the flexible insulation layer comprises at least one of:
   an insulative wool;
   a foam; and
   a flexible aerogel.

5. The crash survivable memory unit of claim 1, wherein the impact resistant layer comprises a metal.

6. The crash survivable memory unit of claim 5, wherein the impact resistant layer is deformable.

7. The crash survivable memory unit of claim 1, wherein the impact resistant layer comprises a composite material.

8. The crash survivable memory unit of claim 1, wherein the memory unit stores data related to at least one of:
   aircraft operation parameters;
   pilot communications;
   ambient sounds and
   video images.

9. The crash survivable memory unit of claim 1, wherein the memory unit is encased in a heat absorbing material.

10. The crash survivable memory unit of claim 1, wherein the memory unit is at least one of:
    a solid state memory device;
    a tape memory device; and
    a magnetic memory device.

11. A method for protecting a memory unit, the method comprising:
    placing a metallic microlattice layer around a memory unit;
    impregnating the metallic microlattice layer with a heat absorption material;
    placing a flexible insulation layer around the metallic microlattice layer that is impregnated with the heat absorption material; and
    forming an impact resistant layer around the flexible insulation layer.

12. The method of claim 11, wherein the flexible insulation layer is comprised of a flexible aerogel.

13. The method of claim 11, wherein the heat absorption material comprises a phase change material.

14. The method of claim 11, further comprising determining a level of protection for the memory unit, wherein determining the level of protection comprises:
    testing the response of the memory unit to impacts;
    testing the response of the memory unit to a heated environment; and
    testing the interaction of the memory unit with fluids at different pressures.

15. A crash survivable memory unit, comprising:
    a memory device configured to record flight data;
    a flexible insulation layer configured to inhibit thermal energy from conducting from an external side of the flexible insulation layer to an internal side of the flexible insulation layer, wherein the internal side of the flexible insulation layer faces the memory device;
    a microlattice layer abutting the internal side of the flexible insulation layer and enclosing the memory device, the microlattice layer configured to distribute thermal energy that passes through the flexible insulation layer substantially throughout the microlattice layer;
    a heat absorbing material that impregnates the microlattice layer, the heat absorbing material configured to absorb the thermal energy in the microlattice layer; and
    an impact resistant layer encircling the flexible insulation layer, wherein the impact resistant layer is configured to absorb shocks that result from other objects contacting the impact resistant layer.

16. The crash survivable memory unit of claim 15, wherein the impact resistant layer comprises at least one of:
    a composite material; and
    a metal.

17. The crash survivable memory unit of claim 15, wherein the heat absorbing material comprises a phase change material.

18. The crash survivable memory unit of claim 17, wherein the phase change material comprises at least one of:
    a hydrocarbon;
    an organic chemical,
    a fatty acid,
    a salt hydrate; and
    a bicarbonate of soda.

19. The crash survivable memory unit of claim 15, further comprising additional heat absorbing material that is encapsulated within the microlattice layer and envelopes the memory device.

20. The crash survivable memory unit of claim 15, wherein the flexible insulation layer comprises at least one of:
an insulative wool;
a foam; and
a flexible aerogel.

* * * * *